US009297847B2

(12) United States Patent
Oberzaucher et al.

(10) Patent No.: US 9,297,847 B2
(45) Date of Patent: Mar. 29, 2016

(54) METHOD FOR CHECKING A SEPARATION POINT BETWEEN A PHOTOVOLTAIC INVERTER AND POWER SUPPLY NETWORK AND PHOTOVOLTAIC INVERTER

(71) Applicant: Fronius International GmbH, Pettenbach (AT)

(72) Inventors: Friedrich Oberzaucher, Wels (AT); Joachim Danmayr, Nussbach (AT)

(73) Assignee: Fronius International GmbH, Pettenbach (AT)

( * ) Notice: Subject to any disclaimer, the term of this patent is extended or adjusted under 35 U.S.C. 154(b) by 171 days.

(21) Appl. No.: 14/178,456

(22) Filed: Feb. 12, 2014

(65) Prior Publication Data

US 2014/0226365 A1   Aug. 14, 2014

(30) Foreign Application Priority Data

Feb. 14, 2013   (AT) .............................. A 50106/2013

(51) Int. Cl.
*G01R 31/04* (2006.01)
*H02M 7/58* (2006.01)
*G01R 31/327* (2006.01)

(52) U.S. Cl.
CPC ............ *G01R 31/04* (2013.01); *G01R 31/3278* (2013.01); *H02M 7/58* (2013.01)

(58) Field of Classification Search
CPC ............... H02J 3/383; H02J 7/35; H02J 1/00; H02J 2003/388; H02J 3/005; H02J 7/0068; H02J 9/061; G01R 31/04; G01R 31/3278
USPC ........................................ 324/522, 424, 713
See application file for complete search history.

(56) References Cited

U.S. PATENT DOCUMENTS

2010/0226160 A1   9/2010   Prior et al.
2012/0281444 A1 *  11/2012   Dent ....................... H02M 1/32
                                                                363/56.01
2013/0222951 A1 *  8/2013   Zhu ........................ H02H 7/122
                                                                361/18

FOREIGN PATENT DOCUMENTS

CN            202522678 U      11/2012
DE     10 2009 047 980 A1      4/2011
(Continued)

OTHER PUBLICATIONS

Austrian Preliminary Office Action dated Dec. 20, 2013 in Austrian Application No. A 50106/2013 with English translation of the relevant parts.
(Continued)

*Primary Examiner* — Vincent Q Nguyen
(74) *Attorney, Agent, or Firm* — Collard & Roe, P.C.

(57) ABSTRACT

The invention relates to a method for checking a separation point (14) between a photovoltaic inverter (1) and a power supply network (7) having multiple phases (L1, L2, L3) and a neutral conductor (N), wherein multiple switching contacts of the separation point (14) are controlled by the photovoltaic inverter (1), and to a photovoltaic inverter (1). To allow a simple and quick check of the functionality of the separation point (14), the switching contacts of the separation point (14) are each formed by single-pole relays (15-22) and switched in steps according to a switching pattern. For checking switching contacts, a voltage (26, 27, 28) is measured at at least one phase (L1, L2, L3) with respect to the neutral conductor (N), upstream of the separation point (14), and compared to voltage values assigned in accordance with the switching pattern, thereby to deduce the functionality of the switching contacts.

10 Claims, 3 Drawing Sheets

(56) References Cited

FOREIGN PATENT DOCUMENTS

| EP | 2 228 895 | A1 | 9/2010 |
| EP | 2 515 404 | A2 | 10/2012 |
| EP | 2 608 375 | A2 | 6/2013 |

OTHER PUBLICATIONS

DIN V VDE V 0126-1-1, Feb. 2006, total of 10 pages including an English translation of the relevant part, i.e. Chapter 4.1.
DIN VDE 0128, Mar. 1993, total of 20 pages.

* cited by examiner

Fig. 3

| Switching state | Relay State | 26 | 27 | 28 |
|---|---|---|---|---|
| | | | | |
| S1 | all relays 15-22 opened | ≠ | ≠ | ≠ |
| S2 | close relay 18 | ≠ | | |
| S3 | close relay 21 | = | | |
| S4 | open relay 18 | | | |
| S5 | close relay 22 | | | |
| S6 | close relays 15 to 17 | ≠ | ≠ | ≠ |
| S7 | close relays 18 to 20 | = | = | = |
| | | | | |

Fig. 4

| Switching state | Relay State | 26 | 27 | 28 |
|---|---|---|---|---|
| | | | | |
| SA | all relays 15-22 opened | ≠ | ≠ | ≠ |
| SB | close relays 18, 19, 20 | ≠ | ≠ | ≠ |
| SC | open relays 18, 19, 20 | | | |
| SD | open relays 15, 16, 17 | ≠ | ≠ | ≠ |
| | | | | |

METHOD FOR CHECKING A SEPARATION POINT BETWEEN A PHOTOVOLTAIC INVERTER AND POWER SUPPLY NETWORK AND PHOTOVOLTAIC INVERTER

CROSS REFERENCE TO RELATED APPLICATIONS

Applicant claims priority under 35 U.S.C. §119 of Austrian Application No. A 50106/2013 filed on Feb. 14, 2013, the disclosure of which is incorporated by reference.

The invention relates to a method for checking a separation point between a photovoltaic inverter and a power supply network having multiple phases and a neutral conductor, wherein multiple switching contacts of the separation point are controlled by the photovoltaic inverter.

Furthermore, the invention relates to a photovoltaic inverter for converting a DC voltage to an AC voltage, having multiple phases and a neutral conductor, and for supplying the AC voltage to a power supply network having multiple phases and a neutral conductor, comprising a separation point formed by multiple relays having switching contacts for a galvanic separation from the phases and the neutral conductor of the power supply network.

Usually, an arrangement composed of one respective pair of relays per phase is used as a separation point between the photovoltaic inverter and the power supply network in order to obtain a safe separation from the network, as is known from EP 2 228 895 A1. Compliance with relevant standards and regulations is required for allowing network-parallel supply by inverters without galvanic separation. For example, a disconnection device composed of two units independent from each other for network monitoring with associated switches connected in series is required by the standard according to VDE V 0126-1-1.

A disadvantage of the methods and devices known from the prior art is that respective measuring of voltages is required at at least two different positions. As a consequence, the circuitry becomes more complex and costs increase.

Additionally, the requirements according to these standards also make it necessary to check the proper function of the relays of the separation point on a regular basis. In these checks, the actual capability of the relays to open and close is being tested. If a relay does not work properly, the inverter is prevented from supplying any more voltage.

The object of the present invention is to provide a method as mentioned above and a photovoltaic inverter which may be performed and/or implemented in a simple and economical manner and which make it possible to check the functionality of the separation point with little effort required for measuring.

This object is achieved in terms of the method in that the switching contacts of the separation point are each formed by single-pole relays and connected stepwise according to a switching pattern, and a voltage is measured at at least one phase with respect to the neutral conductor, upstream of the separation point in order to check multiple switching contacts, and compared to values of the voltage assigned in accordance with the switching pattern, thereby deducing the functionality of the switching contacts. Due to the low number of measuring operations the functionality of the relays may be checked very fast. Another advantage is the very low number of switching states of the switching pattern required for the check, thereby prolonging the lives of the relays. Furthermore, currents that might be created by charge reversal processes within the filter and grounding capacitors are minimised due to the special switching patterns. This is important for three-phased photovoltaic inverters without transformers and without relation of the centre to a neutral conductor, since otherwise high leakage currents might pass the capacitor of the photovoltaic generator during the checking of the relays and/or the first switching of the relays, causing a possibly present circuit breaker to trip. It is also advantageous that the relays upstream and downstream of the separation point need not necessarily be arranged on one potential and may be separated spatially as well (such as on two circuit boards).

Advantageously, each of the voltages is measured at each phase with respect to the neutral conductor upstream of the separation point by a single measuring unit per phase.

According to a further aspect of the invention, a current passes capacitors of a network filter in at least one switching state of the switching pattern, so the relays of the separation point are checked by measuring the voltages.

The voltages required for the measuring of the voltage may be provided by the power supply network or by the photovoltaic inverter.

According to another aspect, the control of the switching contacts upstream and downstream of the separation point is performed by two controllers independent from each other and connected to each other by a data bus, wherein the comparison between the measured values of the voltage and the values assigned is performed by the controller upstream of the separation point.

The switching pattern is implemented by a stepwise switchover of the switching contacts of the separation point from one switching state to another switching state, wherein the functionality of the individual switching contacts of the separation point is deduced from the different switching states or the switchover of the switching states.

The object according to the invention is also achieved by a photovoltaic inverter as mentioned above wherein the separation point is composed of at least six relays with one switching contact each, and two relays independent from each other are connected in series for every connection of the phases.

In order to check the functionality of the separation point, devices for measuring the voltages of the phases with respect to the neutral conductor are provided upstream of the separation point.

Advantageously, two controllers independent from each other are provided upstream and downstream of the separation point, which controllers are connected to each other by a data bus.

The controller connected to and controlling the relays upstream of the separation point is advantageously configured for processing the measured voltage and as master.

According to another aspect of the invention, one respective relay is arranged in the neutral conductor.

Furthermore, it is advantageous for the separation point to include a network filter having capacitors, wherein the network filter is arranged between the relays of a phase which are connected in series and/or the neutral conductor.

The present invention is explained in more detail with reference to the accompanying schematic drawings.

In the drawings:

FIG. 3 shows a table including the switching pattern for the checking of the relays according to FIG. 2; and FIG. 4 shows a table including the switching pattern for the checking of the relays according to a further exemplary embodiment.

Initially, it is noted that like parts of the exemplary embodiment will be designated by like reference numerals.

FIG. 1 illustrates a design of a known photovoltaic inverter 1, more exactly an HF inverter. Since the individual components and/or assemblies and functions of photovoltaic inverters 1 are already known from the prior art, they will not be discussed in more detail below.

Figure 1:
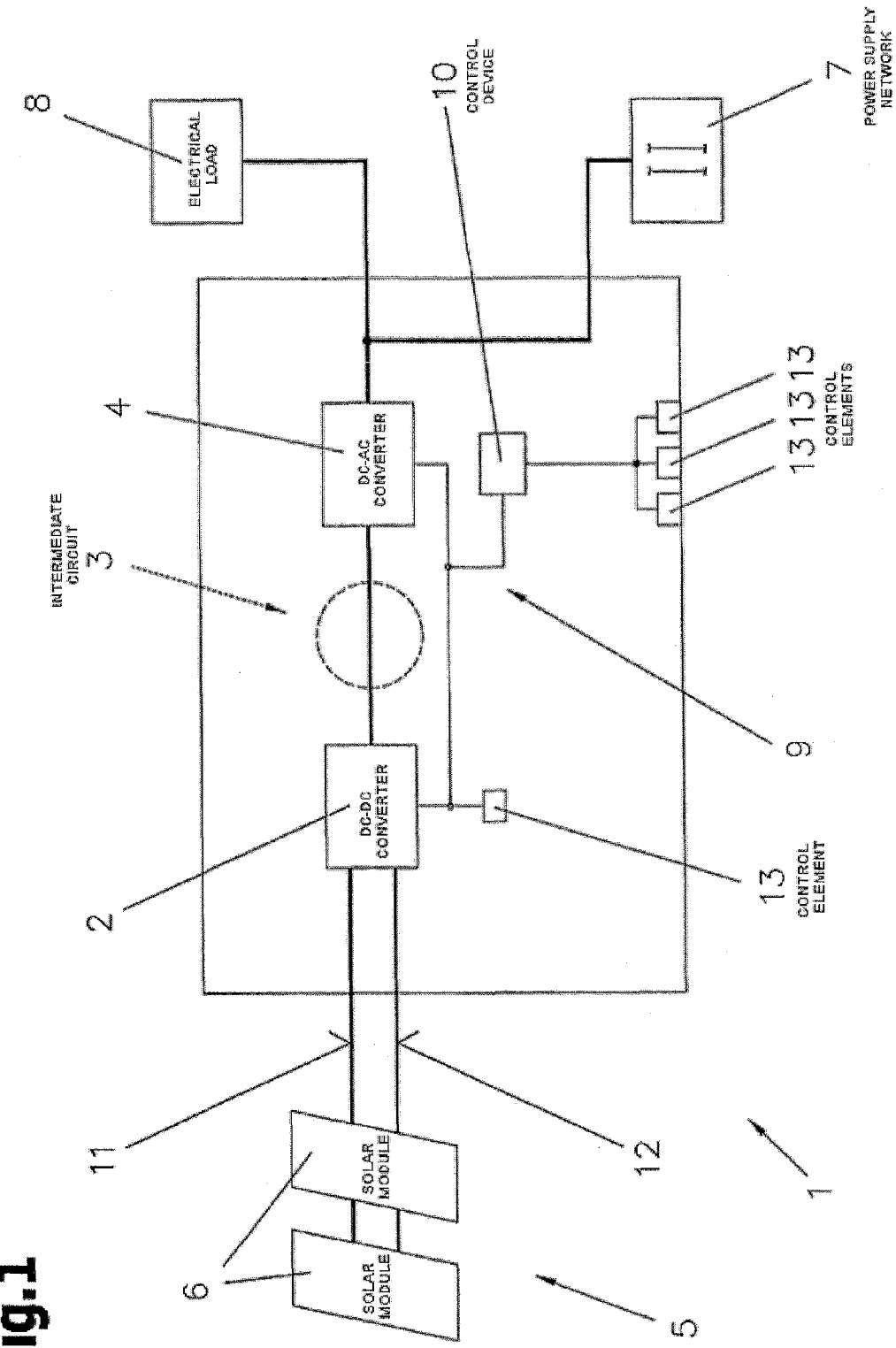
FIG. 1 shows a schematic overview of an inverter of a photovoltaic system.

The photovoltaic inverter 1 has at least an input DC-DC converter 2, an intermediate circuit 3 and an output DC-AC converter 4. A power source 5 and/or a power generator, which is preferably formed by one or more solar modules 6 connected to each other in parallel and/or in series, is connected to the input DC-DC converter 2. The photovoltaic inverter 1 and the solar modules 6 are also called a photovoltaic system or a PV system. The output of the photovoltaic inverter 1 and/or the output DC-AC converter 4 may be connected to a power supply network 7 such as a public or private AC network or a multi-phase network and/or at least one electrical load 8. A load 8 may be formed by a motor, a refrigerator, a radio device or the like. Likewise, the load 8 may also be a house supply system. The individual components of the photovoltaic inverter 1 such as the input DC-DC converter 2 etc. may be connected to a control device 10 via a data bus 9.

Preferably, such photovoltaic inverter 1 serves as a network-connected photovoltaic inverter 1, the power management of which is optimised to supply as much power to the power supply network 7 as possible. As is known from the prior art, the loads 8 are supplied via the power supply network 7. Of course several photovoltaic inverters 1 connected in parallel may be used as well. This allows to provide more power for the operation of the loads 8. This power is supplied in the form of DC voltage by the power source 5, which is connected to the photovoltaic inverter 1 via two connection lines 11, 12.

The control device 10 or the controller of the photovoltaic inverter 1 is formed, for example, by a micro-processor, a micro-controller or a computer. The control device 10 allows to perform a respective control of the individual components of the photovoltaic inverter 1 such as the input DC-DC converter 2 or the output DC-AC converter 4, in particular the switching elements arranged therein. For this purpose, the individual regulation and/or control procedures are stored within the control device 10 in the form of corresponding software programs and/or data or characteristic curves.

Furthermore, control elements 13 allowing the user to configure the photovoltaic inverter 1 and/or display (by means such as light emitting diodes) and adjust operating conditions or parameters, for example, are connected to the control device 10. The control elements 13 may be connected to the control device 10 by the data bus 9 or directly. Such control elements 13 are arranged on a front of the photovoltaic inverter 1, for example, so they may be operated from the outside. Likewise, the control elements 13 may be arranged directly on assemblies and/or modules within the photovoltaic inverter 1.

When using a photovoltaic inverter 1 for supplying a power supply network 7, it is required by standards (e. g. according to E DIN VDE 0128) to interpose a separation point 14 between the photovoltaic inverter 1 and the power supply network 7. This separation point 14 must be checked for proper functioning prior to the connection of the photovoltaic inverter 1 to the power supply network 7.

According to the invention, the separation point 14 between the photovoltaic inverter 1 and the three-phased power supply network 7 comprises at least six single-pole relays 15 to 20. In addition, two relays 21 and 22 may be provided for the neutral conductor N as well. Each of these relays 15-22 has a control coil and a switching contact connected thereto. The separation point 14 according to FIG. 2 includes two relays 15-22 connected in series, each of them independently controllable, in each line between the photovoltaic inverter 1 and the power supply network 7. The phase L1 on the side of the photovoltaic inverter 1 is connected to the phase L1 of the power supply network 7 via the relays 15, 18. The phase L2 on the side of the photovoltaic inverter 1 is connected to the phase L2 of the power supply network 7 via the relays 16, 19. The phase L3 on the side of the photovoltaic inverter 1 is connected to the phase L3 of the power supply network 7 via the relays 17, 20. Finally, the neutral conductor N on the side of the photovoltaic inverter 1 is connected to the neutral conductor N of the power supply network 7 via the relays 21, 22. As a consequence, eight single-pole relays 15-22 are included within the separation point 14. In general, the checking of the switching contacts of the relays 15-22 of the separation point 14 is performed by measuring a voltage, wherein the measuring is conducted upstream of the separation point 14 and/or on the side of the photovoltaic inverter 1—i.e. between photovoltaic inverter 1 and separation point 14. The functionality of the relays 15-22 is then inferred from this measurement. The switching of the relays 15-22 is controlled by two controllers 23, 24 independent from each other, which communicate via a data bus 25. Each of these controllers 23, 24 controls the same number of relays 15-22, that is at least three relays, four relays 15, 16, 17, 21, and 18, 19, 20, 21, respectively, according to FIG. 2. Preferably, the controller 23 upstream of the separation point 14 is configured as the master so it also sets how the other controller 24 should control the relays 18, 19, 20, 22 downstream of the separation point 14.

The measuring of the voltages is done by one measuring unit 26-28 per phase L1, L2, L3, for example, with the voltages of the phases L1, L2, L3 being measured with respect to the neutral conductor N. The measuring units 26-28 are connected to the controller 23.

This switching arrangement makes it possible to check the switching contacts of each relay 15-22. The measuring voltage required is either supplied by the power supply network 7 or by the photovoltaic inverter 1 in the case of an isolated inverter. The measuring voltage is substantially equal to the voltages at the phases L1, L2, L3.

For the method according to the invention it is presupposed that the system is a monolithic three-phase system which is adapted to supply power to the power supply network 7 between phase L1, L2, L3 and phase L1, L2, L3. The neutral conductor N must not be connected to the centre of the intermediate circuit.

The method according to the invention for checking the switching contacts of the relays 15-22 is controlled and implemented by a software, for example. In order to allow the checking of the individual switching contacts of the relays 15-22, the switching pattern shown in the table of FIG. 3 can be used in combination with the evaluation table depicted therein, for example. If the respective measuring results according to the evaluation table are met in the corresponding switching states S1-S7, the relays 15-22 are functional.

All switching states S1-S7, which are used during the check in stepwise fashion, will be described below. The switchover from one state to the next state is carried out by switching the relays 15-22 as required by the next state, wherein the control for switching is performed by the controllers 23, 24 as appropriate.

In the switching states S1-S7, the voltages are measured at the phases L1, L2, L3 by the measuring units 26-28 upstream of the separation point 14 with respect to the neutral conductor N. This means that only the respective voltage value upstream of the separation point 14 is measured, so one measuring unit 26-28 per phase L1, L2, L3 is sufficient.

In switching state S1 of the inventive sequence for the check of the relays 15-22, all switching contacts of the relays 15-22 are opened. In this state, measurements must not give any results.

For the second switching state S2, relay 18 is closed. As a consequence, the first measuring unit 26 must not give any result and/or voltage since relay 21 is still opened. Accordingly, relay 21 is being checked. If a voltage is measured, the switching contact of relay 21 is stuck.

In the third switching state S3, relay 21 is closed as well. If the relays are functioning properly, this leads to a result in the first measuring unit 26 as the capacitors of the network filter 29 allow an electric circuit. Here, the capacitors are each arranged between phase L1, L2, L3 and the neutral conductor N, respectively. The measuring units 27 and 28 also provide results, but without affecting the check. If no voltage is measured in any of the three measuring units 26, 27, 28, either at least one switching contact of one of the relays 15-17 is stuck or one of the relays 21, 22 cannot be closed properly since the capacitors of the network filter 29 would prevent measuring by short-circuiting the measuring units 26, 27, 28.

In the following fourth switching state S4, relay 18 is opened, thus enabling the capacitors of the network filter 29 to unload. Thereby, error currents to the ground are avoided and an uninterrupted check is guaranteed. Switching state S4 does not involve a check of a relay 15-22.

In the following fifth switching state S5, relay 22 is closed so that both relays 21, 22 in the neutral conductor N are closed. This allows closing the relays 15, 20 of the phases L1, L2, L3 without creating leaking currents to the ground. Switching state S5 does not involve a check of a relay 15-22.

According to switching state S6, relays 15-17 are closed. Here, all three measuring units 26 to 28 must not give any results since relays 18-20 are opened so that no closed circuit is present. This means that relays 18-20 are being checked in this switching state S6.

Next, relays 18-20 are closed in switching state S7. As a consequence, all three measuring units 26, 27, 28 give results, provided that all relays 15-22 are functional. This means that all relays 15-22 are being checked.

The table according to FIG. 3 summarises the switching states of the relays 15-22 and the corresponding expected results of the measuring units 26, 27, 28. If the measured result and the expected result do not match, the switching contact of the relay or relays checked in this switching state is stuck.

Figure 2:
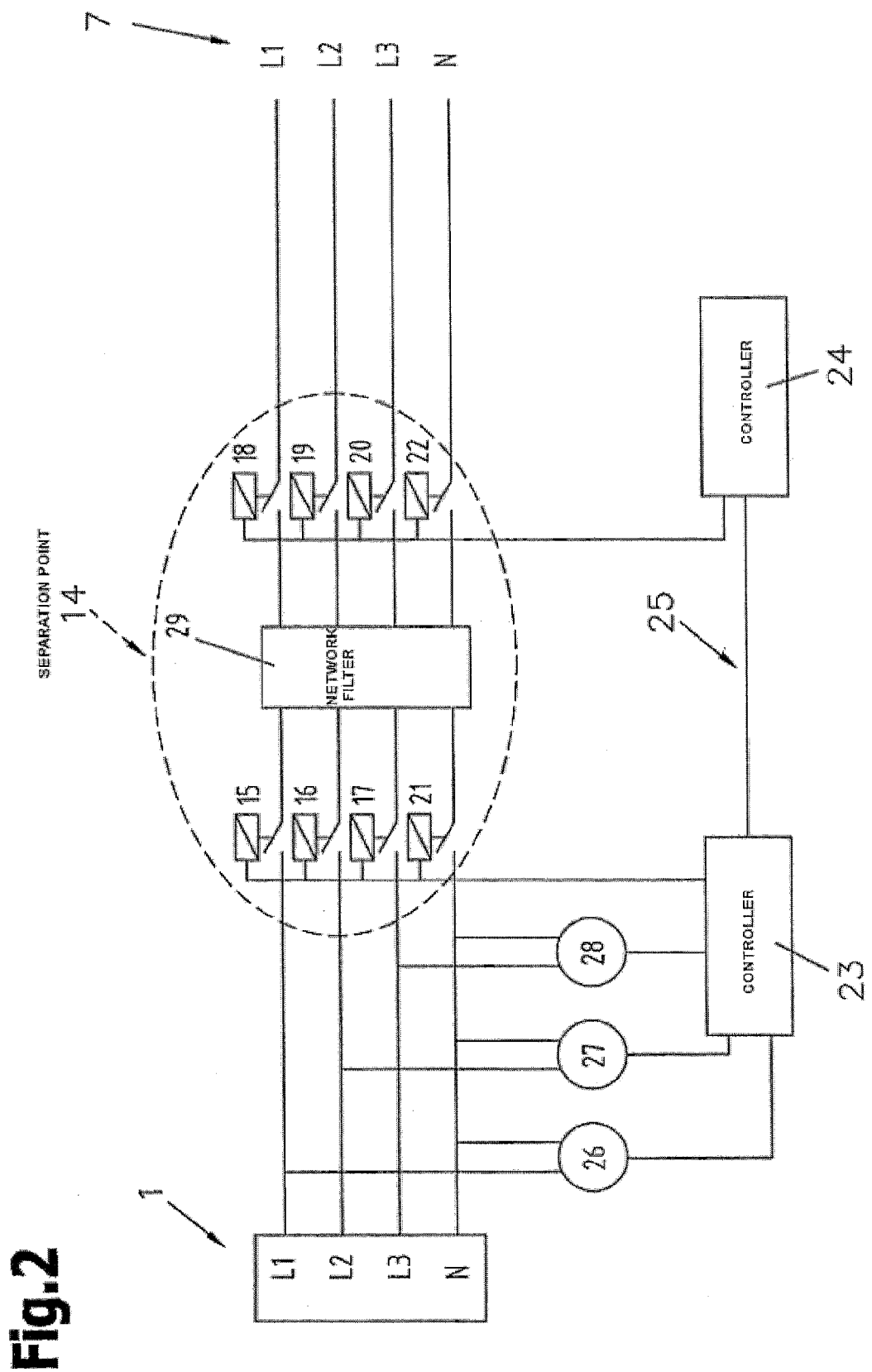
FIG. 2 shows a design of a separation point having eight single-pole relays.

The table according to FIG. 4 illustrates the switching pattern for the detection of a stuck switching contact of at least one of the relays 15-20 in the phases L1, L2, L3 without the relays 21, 22 in the neutral conductor N. Only the differences to FIG. 2 are described below, so parts of the description of FIG. 2 apply here as well.

In switching state SA of the inventive procedure for the check of relays 15-20, all relays 15-20 are opened. No measuring unit 26, 27, 28 must give any result in switching state SA. Accordingly, all relays 15-20 are being checked.

In the second switching state SB, relays 18, 19 and 20 are being closed. No voltage may be measured, otherwise a switching contact of any of the relays 15, 16 and 17 is stuck.

In the third switching state SC, relays 18 to 20 are opened again.

Next, relays 15-17 are closed in the fourth switching state SD. Again, no voltage may be measured, otherwise a switching contact of any of the relays 18-20 is stuck.

This means that in every switching state, relays 15-20 are switched accordingly, wherein the switching state of the previous switching state is kept unless it is changed with the current switching state.

In general, the voltages of all phases L1, L2, L3 are measured every time in each switching state while the voltages according to the table have to be matched for checking the functionality of relays 15-20. Furthermore, the measuring units 26, 27, 28 do not give the exact voltage upstream of the separation point 14, i. e. upstream of the network filter 29. Because of the capacitors of the network filter 29, the voltage exhibits a phase shift. The amplitude of the voltage remains unchanged.

The invention claimed is:

1. A method for checking a separation point between a photovoltaic inverter and a power supply network having a plurality of phases and a neutral conductor, wherein a plurality of switching contacts of the separation point are controlled by the photovoltaic inverter, wherein the switching contacts of the separation point are each formed by respective single-pole relays and switched in steps according to a switching pattern, and a voltage is measured at at least one phase with respect to the neutral conductor, upstream of the separation point, for checking several switching contacts, and compared to values of the voltage assigned in accordance with the switching pattern from which the functionality of the switching contacts is deduced, and wherein the switching pattern is implemented by a stepwise switchover of the switching contacts of the separation point from one switching state to another switching state, wherein the functionality of the individual switching contacts of the separation point is deduced from the different switching states or the switchover of the switching states.

2. The method according to claim 1, wherein the voltages at each phase are measured with respect to the neutral conductor, upstream of the separation point, by a single measuring unit per phase.

3. The method according to claim 1, wherein a current passes capacitors of a network filter in at least one switching state for checking the relays by measuring the voltages.

4. The method according to claim 1, wherein the voltage is provided by the power supply network.

5. The method according to claim 1, wherein the voltage is provided by the photovoltaic inverter.

6. The method according to claim 1, wherein the control of the switching contacts upstream and downstream of the separation point is performed by two controllers independent from each other and connected to each other by a data bus, wherein the comparison between the measured values of the voltage and the values assigned is performed by the controller upstream of the separation point.

7. A photovoltaic inverter for converting a DC voltage to an AC voltage, having a plurality of phases and a neutral conductor, and for supplying the AC voltage to a power supply network having at least first, second, and third phases and a neutral conductor, comprising a separation point formed by at least first, second, third, fourth, fifth, and sixth relays having switching contacts for a galvanic separation from the at least first, second, and third phases and the neutral conductor of the power supply network, wherein the separation point is composed of the at least first, second, third, fourth, fifth, and sixth relays with one switching contact each, and the first and fourth relays, the second and fifth relays, and the third and sixth relays are respectively connected in series for connecting the first, second, and third phases, respectively, wherein devices for measuring the voltages of the phases with respect to the neutral conductor are provided upstream of the separation point, and further comprising first and second controllers respectively upstream and downstream of the separation point, wherein the first and second controllers are independent from each other and connected to each other by a data bus.

8. The photovoltaic inverter according to claim 7, further comprising a seventh relay, wherein the first, second, third, and seventh relays are upstream of the separation point, and wherein the first controller is connected to and controls the first, second, third, and seventh relays upstream of the separation point and is designed for processing the measured voltage and as master.

9. The photovoltaic inverter according to claim 8, wherein the seventh relay is arranged in the neutral conductor.

10. The photovoltaic inverter according to claim 7, wherein the separation point includes a network filter, which network filter is arranged between the first and fourth relays, the second and fifth relays, and the third and sixth relays connected in series.

\* \* \* \* \*